(12) United States Patent
Hall et al.

(10) Patent No.: US 11,652,445 B2
(45) Date of Patent: May 16, 2023

(54) HIGH STABILITY OPTOELECTRONIC OSCILLATOR AND METHOD

(71) Applicant: Nanowave Technologies Inc., Etobicoke (CA)

(72) Inventors: Trevor James Hall, Ottawa (CA); Charles William Tremlett Nicholls, Nepean (CA); Boris Spokoinyi, Kanata (CA); Mehedi Hasan, Ottawa (CA)

(73) Assignee: Nanowave Technologies Inc., Etobicoke (CA)

( * ) Notice: Subject to any disclaimer, the term of this patent is extended or adjusted under 35 U.S.C. 154(b) by 0 days.

(21) Appl. No.: 17/634,602

(22) PCT Filed: Aug. 13, 2020

(86) PCT No.: PCT/CA2020/051110
§ 371 (c)(1),
(2) Date: Feb. 11, 2022

(87) PCT Pub. No.: WO2021/026658
PCT Pub. Date: Feb. 18, 2021

(65) Prior Publication Data
US 2022/0278648 A1    Sep. 1, 2022

Related U.S. Application Data

(60) Provisional application No. 62/886,039, filed on Aug. 13, 2019.

(51) Int. Cl.
*H03B 17/00*    (2006.01)
*H03L 7/081*    (2006.01)
(Continued)

(52) U.S. Cl.
CPC .............. *H03B 17/00* (2013.01); *H03L 7/00* (2013.01); *H03L 7/081* (2013.01); *H03L 7/087* (2013.01);
(Continued)

(58) Field of Classification Search
CPC ... H03B 17/00; H03B 2200/0044; H03L 7/00; H03L 7/0816; H03L 7/0812
See application file for complete search history.

(56) References Cited

U.S. PATENT DOCUMENTS

2002/0106142 A1    8/2002  Huang et al.
2004/0152433 A1    8/2004  Braithwaite
(Continued)

OTHER PUBLICATIONS

Bluestone, Aaron, et al. "An ultra-low phase-noise 20-GHz PLL utilizing an optoelectronic voltage-controlled oscillator." IEEE transactions on microwave theory and techniques 63.3 (2015): 1046-1052. (Year: 2015).*
(Continued)

*Primary Examiner* — Ryan Johnson
(74) *Attorney, Agent, or Firm* — Borden Ladner Gervais LLP; Curtis B. Behmann

(57) ABSTRACT

An optoelectronic oscillator (OEO) including a drift compensation circuit is provided. The OEO includes a set of optical domain components communicatively coupled with a set of RF domain components. The RF domain components include a mode selection filter, a phase locked loop (PLL) and a drift compensation circuit communicatively coupled between the mode selection filter and the PLL. The mode selection filter provides a mode selection result to the drift compensation circuit. The drift compensation circuit phase modulates the mode selection result in a vector based coordinate system to maintain a drift compensated mode selection result within a locking bandwidth of the PLL, and to minimize phase shifting from accumulating phase drift.

(Continued)

The PLL detects a phase difference between the drift compensated mode selection result and a reference signal, for use in maintaining the PLL in a phase lock with the reference signal, in particular over wide operational temperature ranges.

20 Claims, 17 Drawing Sheets

(51) Int. Cl.
    *H03L 7/087*     (2006.01)
    *H04B 10/50*     (2013.01)
    *H03L 7/00*     (2006.01)

(52) U.S. Cl.
    CPC .......... *H03L 7/0816* (2013.01); *H04B 10/50* (2013.01); *H03B 2200/0044* (2013.01)

(56) References Cited

U.S. PATENT DOCUMENTS

| | | | |
|---|---|---|---|
| 2005/0057791 A1* | 3/2005 | Sayyah | H03L 7/099 359/245 |
| 2013/0259072 A1* | 10/2013 | Maleki | H01S 5/0656 372/20 |
| 2014/0270786 A1 | 9/2014 | Poddar et al. | |

OTHER PUBLICATIONS

Dai, Jian, et al. "Stabilized optoelectronic oscillator with enlarged frequency-drift compensation range." IEEE Photonics Technology Letters 30.14 (2018): 1289-1292. (Year: 2018).*
International Patent Application No. PCT/CA2020/051110, International Search Report and Written Opinion dated Nov. 30, 2020.
International Patent Application No. PCT/CA2020/051110, International Preliminary Reporton Patentability dated Feb. 8, 2022.

* cited by examiner $\theta = \theta' + \Delta\theta = \theta' + V_{tune}/K_\theta$; where $\theta'$ is the previous stored total phase drift $K_\theta$ = degrees/volt V = maximum modulator gain $V_I$ = in-phase voltage applied to vector modulator $V_Q$ = quadrature voltage applied to vector modulator

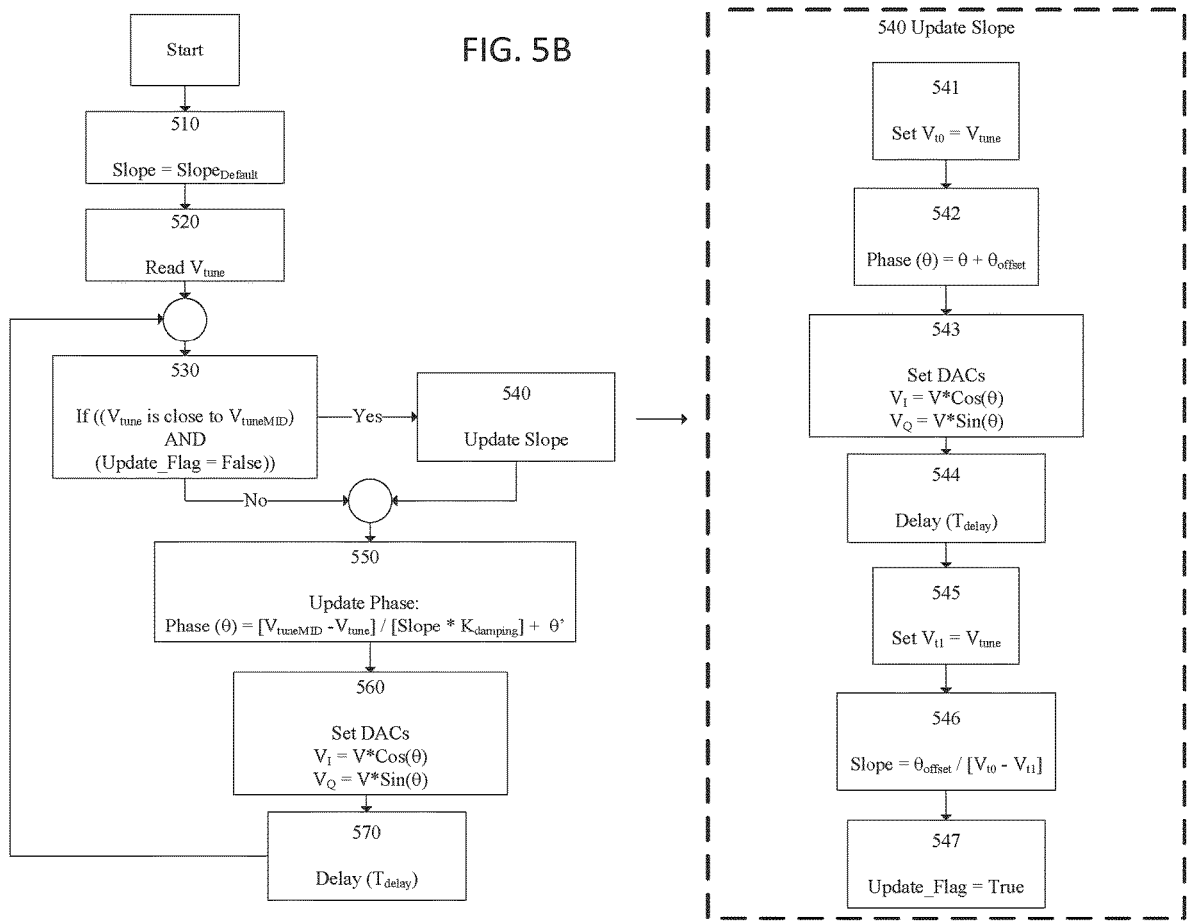

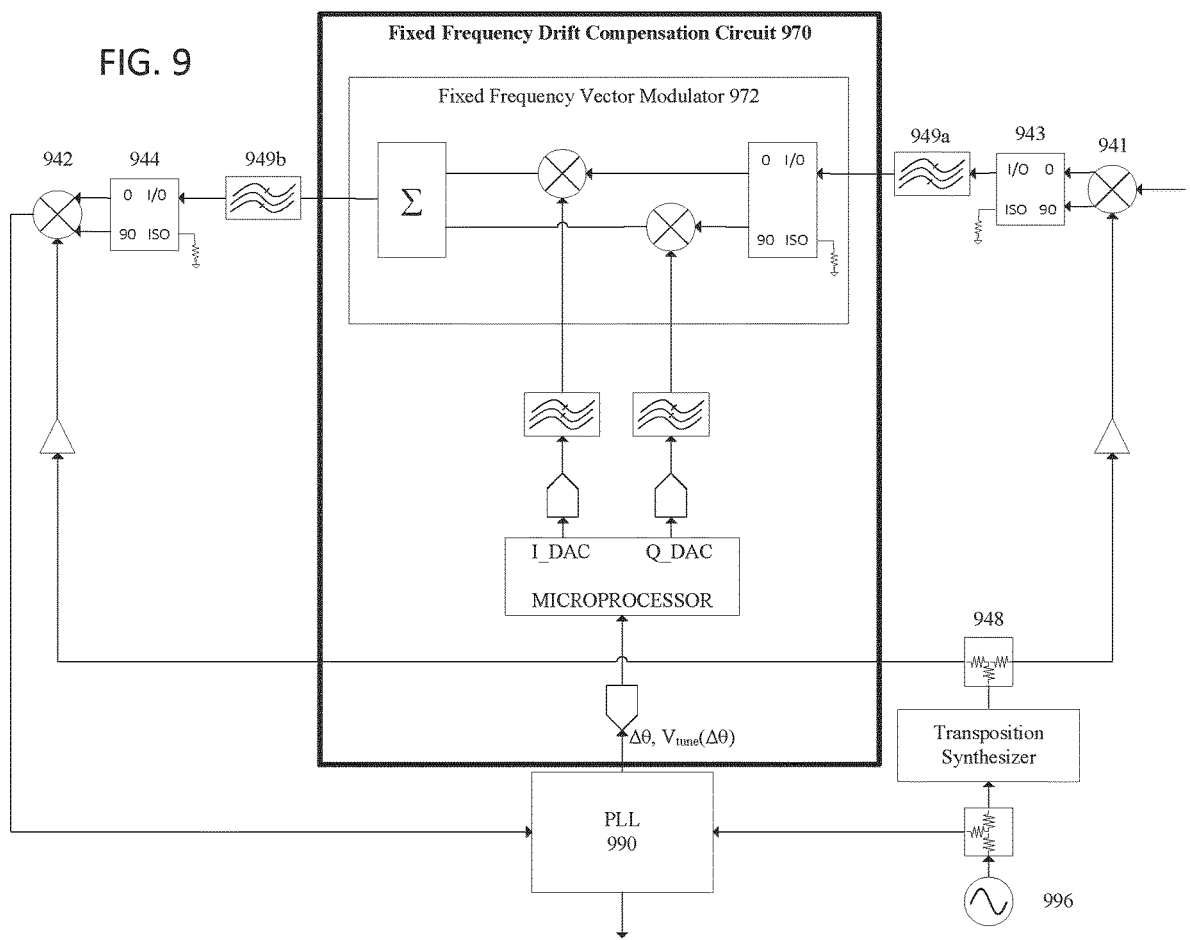

HIGH STABILITY OPTOELECTRONIC OSCILLATOR AND METHOD

CROSS REFERENCE TO RELATED APPLICATIONS

The present disclosure is related to co-pending patent applications entitled "TRANSPOSED DELAY LINE OSCILLATOR AND METHOD OF TRANSPOSITION" and "DELAY DEVICE AND METHOD OF EMULATING RADAR SIGNAL PROPAGATION DELAYS" filed of even date herewith, which are incorporated herein by reference.

FIELD

The present disclosure relates to RADAR (Radio Detection and Ranging) systems, including but not limited to improving RADAR sensitivity with optoelectronic oscillators (OEO).

BACKGROUND

Oscillators having low phase noise and a wide tuning bandwidth are desirable for radio equipment including telecommunications, RADAR, and electromagnetic sensor systems. Phase noise represents the random fluctuation in signal phase with time, and results in a reduction in detection sensitivity of the system in which the oscillator is used. In the case of RADAR, reducing phase noise improves system sensitivity, resulting in increased operational range or minimum target scattering cross section. In the case of a telecommunications system, reducing phase noise results in: increased maximum data rate; reduction in the bit error rate; and an increase in the number of channels that can be placed in a specified bandwidth by virtue of the reduction in the guard band requirements.

Conventional RADAR systems may employ an Optoelectronic Oscillator (OEO) as a signal source, for example to generate a reference signal. OEOs provide the lowest phase noise, widest bandwidth signal sources currently available in the microwave and millimeter frequency range. The low phase noise characteristics of an OEO are desirable as phase noise results in a spreading in frequency of the transmitted RADAR pulse signal. However, such spectral broadening moves stationary ground clutter into the moving target Doppler bins, causing a degradation in the minimum detectable signal level for the RADAR system. To reduce phase noise, conventional OEO systems employ a delay line, such as a length of single mode optical fiber. While increased delay reduces phase noise, it also results in narrower mode spacing. Typical optical delay lines consist of between 1 km and 15 km of a single mode optical fiber wound on a spool.

Conventional OEO systems typically require phase locking to a system reference or a reference oscillator. However, conventional optical delay lines are susceptible to mechanical perturbances and thermal contraction and expansion, causing phase shifts which may result in the OEO unlocking.

Improvements in RADAR systems and OEOs are desirable.

BRIEF DESCRIPTION OF THE DRAWINGS

Embodiments of the present disclosure will now be described, by way of example only, with reference to the attached Figures.

FIG. 5B illustrates phase modulation in a vector-based coordinate system, using an OEO according to an embodiment of the present disclosure further comprising maintaining a phase lock at a phase offset.

FIG. 9 illustrates an embodiment of a drift compensation circuit comprising a vector modulator according to FIG. 6, transposed to an intermediate frequency.

BRIEF SUMMARY

Figure 1:
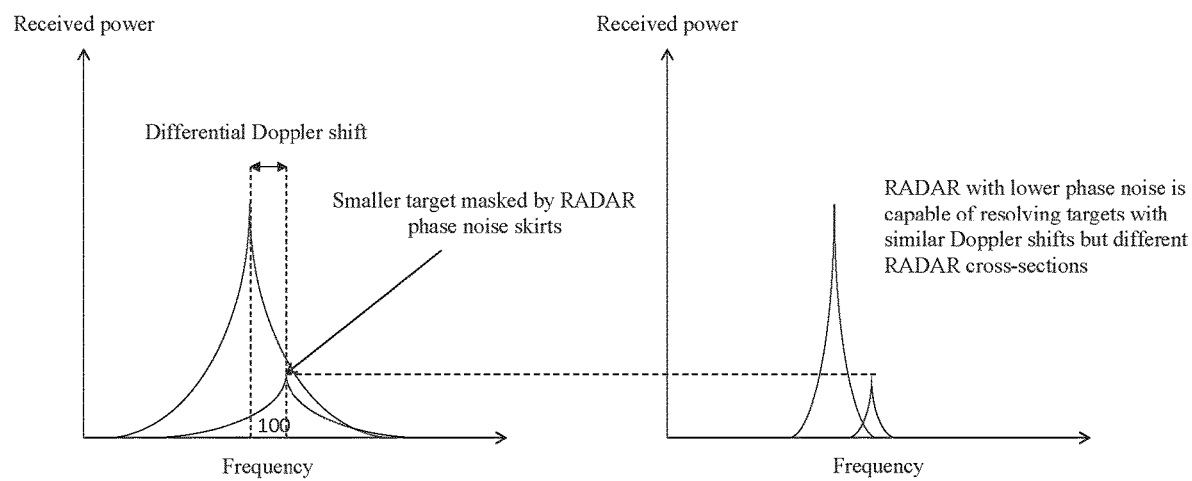
FIG. 1 illustrates two graphs demonstrating the impact of phase noise on spectral broadening.

The following presents a simplified summary of the disclosure in order to provide a basic understanding of some aspects of the disclosure. It is not intended to identify key or critical elements of the embodiments or to delineate the scope of the embodiments. The following summary merely presents some concepts of the disclosure in a simplified form as a prelude to the more detailed description provided below.

In an aspect, an optoelectronic oscillator (OEO) is provided, comprising a set of optical domain components; a downconverter in communication with an output of the set of optical domain components; a set of radio frequency (RF) domain components in communication with an output of the downconverter, the set of RF domain components including: a mode selection filter in communication with the output of the downconverter, the mode selection filter configured to output a mode selection result; a drift compensation circuit configured to receive the mode selection result from the mode selection filter and to phase modulate the mode selection result, based on a stored total phase drift, in a vector based coordinate system, for outputting a drift compensated mode selection result; and a phase locked loop (PLL) in communication with the drift compensation circuit, the PLL configured to detect a phase difference between a local oscillator signal and the drift compensated mode selection result for use in maintaining the PLL in a phase lock with the local oscillator signal, an output of the PLL being coupled to an input of the set of optical domain components, and the drift compensation circuit being configured to: receive the detected phase difference from the PLL; and update the stored total phase drift based on the received detected phase difference, for use in maintaining the drift compensated mode selection result within a locking bandwidth of the PLL.

In an example OEO embodiment, the drift compensation circuit further comprises a vector modulator configured to generate the drift compensated mode selection result, based on: mixing the mode selection result in-phase, with an in-phase component of the stored total phase drift, and mixing the mode selection result in quadrature, with a quadrature component of the stored total phase drift.

In an example OEO embodiment, the vector modulator further comprises a hybrid coupler configured to receive the mode selection result and provide the mode selection result in-phase and the mode selection result in quadrature. In another embodiment, the vector modulator further comprises: an in-phase image rejection mixer configured to receive the mode selection result in-phase, for mixing with the in-phase component of the stored total phase drift, and a quadrature image rejection mixer configured to receive the mode selection result in quadrature for mixing with the quadrature component of the stored total phase drift.

In an example OEO embodiment, the drift compensation circuit further comprises: a processor configured to store the total phase drift and update the stored total phase drift based on the received detected phase difference from the PLL. In an embodiment the processor is configured to provide: the in-phase component of the stored total phase drift based on a cosine function of the stored total phase drift, and the quadrature component of the stored total phase drift based on a sine function of the stored total phase drift.

In an example OEO embodiment, the received detected phase difference from the PLL is provided as a control voltage, the drift compensation circuit further comprising an analog-to-digital converter (ADC) coupled between the PLL and the processor, the ADC configured to provide a sampled output based on the received detected phase difference from the PLL, the processor configured to update the stored total phase drift based on the ADC sampled output; an in-phase digital-to-analog converter (I_DAC) coupled between the processor and the vector modulator and configured to provide the in-phase component of the stored total phase drift, and a quadrature digital-to-analog converter (Q_DAC) coupled between the processor and the vector modulator and configured to provide the quadrature component of the stored total phase drift. In an embodiment, the drift compensation circuit is configured to update the stored total phase drift based on the ADC sampled output and a phase-to-voltage constant ($K_\theta$). In an embodiment the drift compensation circuit further comprises: a first low pass filter coupled between the I_ADC and the vector modulator, for converting the in-phase component of the stored total phase drift to DC, and a second low pass filter coupled between the Q_DAC and the vector modulator, for converting the quadrature component of the stored total phase drift to DC.

In an example OEO embodiment, the processor scales each of the in-phase component of the stored total phase drift and the quadrature component of the stored total phase drift, based on a maximum gain of the vector modulator.

In an example OEO embodiment, the vector modulator operates at an intermediate frequency, the OEO further comprising a transposition network in communication with the vector modulator, the transposition network configured to: receive the mode selection result from the mode selection filter and downconvert the mode selection result to the intermediate frequency for communication to the vector modulator at the intermediate frequency, and receive the drift compensated mode selection result signal from the vector modulator and upconvert the drift compensated mode selection result to a an OEO output frequency for communication to the OEO. In an embodiment the transposition network further comprises: an input frequency mixer configured to receive the mode selection result and a transposition signal, and an output frequency mixer configured to receive the drift compensated mode selection result and the transposition signal, the transposition signal being tuned for: transposing the mode selection result to the intermediate frequency, and transposing the drift compensated mode selection result to the OEO output frequency. In an embodiment, the transposition network further comprises: a transposition synthesizer configured to generate the transposition signal based on the local oscillator signal provided to the PLL.

In an example OEO embodiment, the PLL further comprises: a phase frequency detector (PFD) configured to receive the drift compensated mode selection result and the local reference signal, and configured to output the detected phase difference, and a phase shifter configured to receive the drift compensated mode selection result and the detected phase difference, and configured to output the PLL output at the OEO output frequency, the locking bandwidth of the PLL being based on a phase range of the phase shifter.

In an example OEO embodiment, the set of optical domain components comprises: an optical source for generating an optical signal, and an optical delay line coupled between the optical source and the output of the set of optical domain components, the optical delay line for reducing phase noise in the optical signal based on a length of the optical delay line.

In an example OEO embodiment, the set of optical domain components further comprises: an optical power splitter coupled between the optical source and the optical delay line, the optical power splitter configured to split the optical signal into a first optical signal and a second optical signal; the optical delay line further comprising a first optical delay line having a first length, and a second optical delay line having a second length greater than the first length; the first optical delay line configured to receive the first optical signal and second delay line configured to receive the second optical signal, and an optical combiner coupled between the delay line and the output of the set of optical domain components, the optical combiner configured to combine an output of the first optical delay line and the second optical delay line. In an embodiment the first length is selected to establish a desired mode spacing of the optical signal, and the second length is selected to reduce a phase noise of the optical signal.

In an example OEO embodiment, the set of optical domain components further comprises: an optical modulator configured to receive the optical signal and the PLL output, the optical modulator configured to modulate the optical signal based on the PLL output.

In an example OEO embodiment, the mode selection filter comprises an electronically tunable filter.

In an example OEO embodiment, the mode selection filter comprises: a first mode selection filter having a first passband; a second mode selection filter having a second passband overlapping with the first passband to define an overlapping passband, and the overlapping passband configured to isolate a desired oscillatory mode. In an embodiment, the first mode selection filter is a first electronically tunable filter and the second mode selection filter is a second electronically tunable filter.

In an example OEO embodiment, the phase lock of the PLL is biased by a phase offset generated by the drift compensation circuit.

In an aspect, a phase shifter is provided, comprising: a phase compensation circuit configured to receive an input signal and to modulate a phase of the input signal in a vector based coordinate system based on a stored total phase shift, for outputting a phase compensated signal; a phase frequency detector (PFD) coupled with the phase compensation circuit in a feedback loop, the PFD configured to detect a phase difference between the phase compensated output and a reference signal, the detected phase difference provided as feedback to the phase compensation circuit, and the phase compensation circuit configured to update the stored total phase shift based on the detected phase difference received from the PFD.

In an example phase shifter embodiment, the phase compensation circuit further comprises: a vector modulator configured to generate the phase compensated output, based on: mixing the input signal in-phase, with an in-phase component of the stored total phase shift, and mixing the input signal in quadrature, with a quadrature component of the stored total phase shift. In an embodiment, the vector modulator further comprises: a hybrid coupler configured to receive the input signal and provide the input signal in-phase and the input signal in quadrature. In an embodiment, the vector modulator further comprises: an in-phase image rejection mixer configured to receive the input signal in-phase, for mixing with the in-phase component of the stored total phase shift, and a quadrature image rejection mixer configured to receive the input signal in quadrature for mixing with the quadrature component of the stored total phase shift.

In an example phase shifter embodiment, the phase compensation circuit further comprises: a processor configured to store the total phase shift and update the stored total phase shift based on the detected phase difference received from the PFD. In an embodiment, the processor is configured to provide: the in-phase component of the stored total phase shift based on a cosine function of the stored total phase shift, and the quadrature component of the stored total phase shift based on a sine function of the stored total phase shift. In an embodiment the detected phase difference received from the PFD is a control voltage, the phase compensation circuit further comprising: an analog-to-digital converter (ADC) coupled between the PFD and the processor, the ADC configured to provide a sampled output based on the detected phase difference received from the PFD, the processor configured to update the stored total phase shift based on the ADC sampled output; an in-phase digital-to-analog converter (I_DAC) coupled between the processor and the vector modulator and configured to provide the in-phase component of the stored total phase shift, and a quadrature digital-to-analog converter (Q_DAC) coupled between the processor and the vector modulator and configured to provide the quadrature component of the stored total phase shift. In an embodiment, the phase compensation circuit is configured to update the stored total phase shift based on the ADC sampled output and a phase-to-voltage constant (Kθ).

In an example phase shifter embodiment the phase compensation circuit further comprises: a first low pass filter coupled between the I_ADC and the vector modulator, for converting the in-phase component of the stored total phase shift to DC, and a second low pass filter coupled between the Q_DAC and the vector modulator, for converting the quadrature component of the stored total phase shift to DC.

In an example phase shifter embodiment, the processor scales each of the in-phase component of the stored total phase shift and the quadrature component of the stored total phase shift, based on a maximum gain of the vector modulator.

In an aspect, a method of shifting a phase of an input signal to match a phase of a reference signal is provided, the method comprising: receiving the input signal, in a vector modulator; generating a phase compensated signal, at an output of the vector modulator, by shifting the input signal phase in a vector based coordinate system based on a stored total phase shift; receiving, at a phase difference detector, the phase compensated signal and the reference signal; detecting a phase difference between the phase compensated signal and the reference signal, to generate a detected phase difference, and updating the stored total phase shift, at the vector modulator, based on receiving the detected phase difference as feedback from the phase frequency detector.

DETAILED DESCRIPTION

For the purpose of promoting an understanding of the principles of the disclosure, reference will now be made to the features illustrated in the drawings and specific language will be used to describe the same. It will nevertheless be understood that no limitation of the scope of the disclosure is thereby intended. Any alterations and further modifications, and any further applications of the principles of the disclosure as described herein are contemplated as would normally occur to one skilled in the art to which the disclosure relates. It will be apparent to those skilled in the relevant art that some features that are not relevant to the present disclosure may not be shown in the drawings for the sake of clarity.

At the outset, for ease of reference, certain terms used in this application and their meaning as used in this context are set forth below. To the extent a term used herein is not defined below, it should be given the broadest definition persons in the pertinent art have given that term as reflected in at least one printed publication or issued patent. Further, the present processes are not limited by the usage of the terms shown below, as all equivalents, synonyms, new developments and terms or processes that serve the same or a similar purpose are considered to be within the scope of the present disclosure.

An optoelectronic oscillator (OEO) including a drift compensation circuit is provided. The OEO includes a set of optical domain components communicatively coupled with a set of Radio Frequency (RF) domain components. The set of RF domain components includes a mode selection filter, a phase locked loop (PLL) and a drift compensation circuit communicatively coupled between the mode selection filter and the PLL. The mode selection filter provides a mode selection result to the drift compensation circuit. The drift compensation circuit phase modulates the mode selection result in a vector based coordinate system to maintain a drift compensated mode selection result within a locking bandwidth of the PLL, and to minimize phase shift arising from accumulating phase drift. The PLL detects a phase difference between the drift compensated mode selection result and a reference signal, for use in maintaining the PLL in a phase lock with the reference signal, in particular in maintaining a phase lock over wide operational temperature ranges.

In the specific case of RADAR systems, phase noise results in a spreading in frequency of the transmitted RADAR pulse signal. As illustrated in FIG. 1, spectral broadening may result in phase noise skirts which mask other signals. Such spectral broadening leads to increased ground clutter, causing a degradation in the minimum detectable signal level for the RADAR system. In contrast, reducing phase noise results in reduced spectral broadening, increased ground clutter suppression, and enables resolving previously masked targets. To reduce phase noise, conventional OEO systems employ a delay line, such as a length of single mode optical fiber. While increased delay reduces phase noise, it also results in narrower mode spacing.

Figure 2:
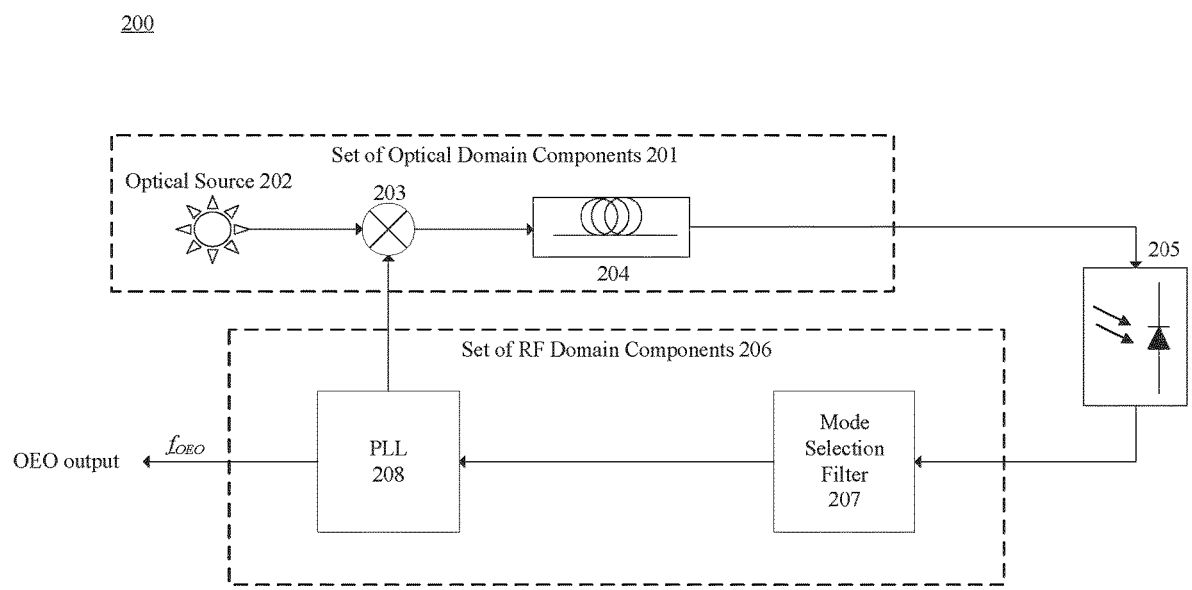
FIG. 2 illustrates a prior art optoelectronic oscillator (OEO).

FIG. 2 illustrates a prior art OEO 200, broadly comprising a set of optical domain components 201 in communication with a set of RF domain components 206. The set of optical domain components 201 may include an optical source 202, optical delay line 204, and optical modulator 203 for modulating the optical source 202 with an output of the set of RF domain components 206. In order for an OEO to have practical application at a microwave output or other RF band output, the set of RF domain components typically includes a PLL 208 for locking the OEO to a local oscillator signal. Conventionally, the PLL maintains a phase lock with the local oscillator signal using a linear phase shifter (not illustrated). The set of RF domain components 206 may include other features such as a mode selection filter 207 for isolating a desired oscillatory mode. As illustrated in FIG. 2, the PLL provides the OEO output at an OEO frequency $f_{OEO}$.

The output of an OEO is a sensitive function of the OEO delay line temperature and other perturbances. For example, temperature fluctuations in the OEO delay line can cause the OEO frequency to drift by hundreds of kilohertz, corresponding to multiple wavelengths at the microwave output frequency. As temperature fluctuations or other perturbances cause the OEO output frequency to drift, the linear phase shifter adjusts for the drift to maintain the OEO output in a phase lock with the reference oscillator. Over time, however, phase drift may accumulate in excess of the linear phase shifter's operational capacities, causing the PLL to unlock. For example, a typical linear phase shifter may have a phase range of up to 400 degrees. As the delay line phase drift accumulates in excess of 400 degrees, the linear phase shifter jams, becoming unable to compensate for the OEO delay line phase drift, causing the PLL to eventually unlock. Once unlocked, the OEO output frequency changes with the temperature fluctuations, potentially resulting in a mode hop. Mode hopping results in abrupt changes in the microwave frequency which is highly undesirable as it leads to false target detection and erratic detection operation of the RADAR system.

One strategy known in the art for addressing the limitations of such a linear phase shifter is to cascade a plurality of linear phase shifters in series. Each additional linear phase shifter provides an incremental increase in bandwidth, extending the operational capacity of the PLL. However, each additional linear phase shifter further introduces additional phase noise and loss, requiring additional gain elements to compensate, which also introduces additional noise. The resulting limited increase in bandwidth is provided at the cost of increased system complexity, additional hardware, and degraded system performance arising from increased phase noise.

Accordingly, embodiments of the present disclosure aim to provide improvements in RADAR systems and OEOs.

Figure 3:
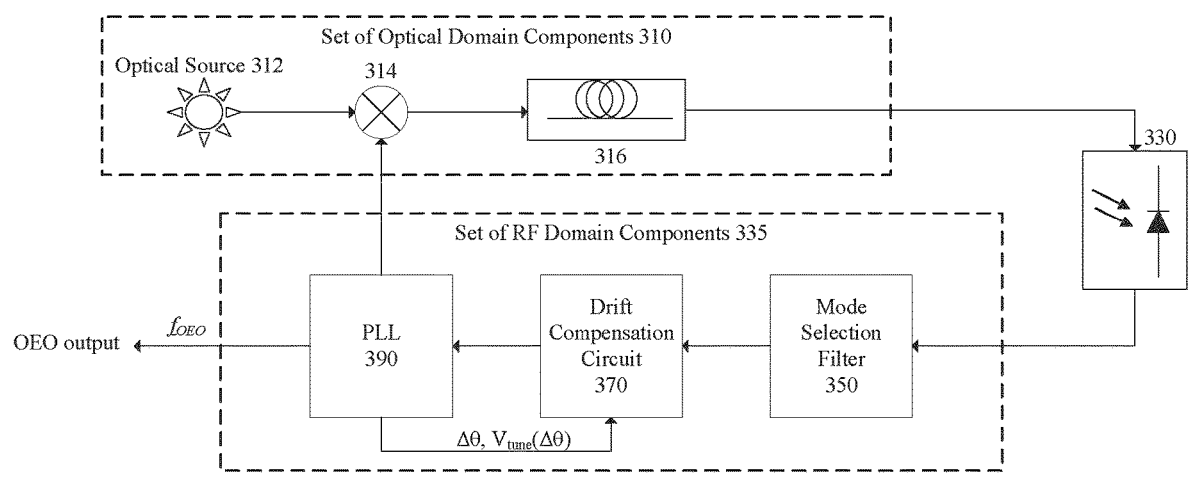
FIG. 3 illustrates an OEO embodiment comprising a drift compensation circuit according to the present disclosure.

A high stability OEO according to an embodiment of the present disclosure enables infinite phase shift control across a PLL locking bandwidth. FIG. 3 illustrates an OEO 300 according to an embodiment of the present disclosure. The OEO 300 comprises a set of optical domain components 310 communicatively coupled to a set of RF domain components 335. In an embodiment, the set of optical domain components 310 comprise an optical source 312, an optical modulator 314 for coupling the optical source 312 with an output of the set of RF domain components 335, and an optical delay line 316. The set of RF domain components 335 comprise a drift compensation circuit 370 communicatively coupled between a mode selection filter 350 and a PLL 390. The drift compensation circuit 370 performs vector-based phase modulation, enabling infinite phase adjustment within a locking bandwidth of the PLL 390. The drift compensation circuit 370 stores, determines, or obtains a total phase drift, for tracking phase drift accumulation in the OEO. In an example implementation, the total phase drift accumulating in the OEO 300 comprises a phase drift arising from thermal expansion and contraction in the OEO delay line 316. The drift compensation circuit 370 substantially continuously updates the stored total phase drift based on a detected phase difference $\Delta\theta$ received from the PLL 390. In an embodiment, the detected phase difference $\Delta\theta$ is provided to the drift compensation circuit for use in determining or obtaining the total phase drift. In an embodiment, the detected phase difference $\Delta\theta$ is provided as a tuning voltage $V_{tune}$ proportional to the detected phase difference $V_{tune}(\Delta\theta)$ As vector-based coordinate systems inherently wrap to 0 degrees from 360 degrees (and vice versa), the drift compensation circuit 370 provides infinite phase correction. Accordingly, the drift compensation circuit 370 can track and correct infinite phase drift in the OEO 300. Minimizing the total phase drift also constrains phase shifts detected by the PLL to small incremental changes within a locking bandwidth of the PLL. In an example embodiment a PLL 390 having a single phase shifting component cooperates with the drift compensation circuit 370 to provide infinite phase shift control within a locking bandwidth of the PLL 390.

In an example embodiment, the total phase drift stored and updated by the drift compensation circuit is based on phase drift accumulated over time in the OEO. In an example implementation, the drift compensation circuit provides infinite phase correction for accumulating phase drift, while the PLL detects and corrects incremental phase shifts. The PLL further provides the incremental phase shift as feedback to the drift compensation circuit, for use in correcting the total phase drift of the OEO. Sources of phase drift in an OEO include thermal expansion or contraction of an optical delay line in the set of optical domain components. Other sources, such as mechanical perturbances, may also impact system phase drift.

As phase drift accumulates over time, it may exceed the available phase range of a conventional phase shifter, such as a linear phase shifter, leading to the OEO becoming unlocked from the system reference signal. Conversely, a drift compensation circuit according to an embodiment herein modulates phase in a vector based coordinate systems, inherently wrapping to 0 degrees from 360 degrees, enabling infinite phase correction. The vector modulator provides the advantage of infinite phase locking range as compared to the finite phase locking range provided by the linear phase shifters in conventional OEOs, which cannot wrap and eventually jam when total phase drift exceeds the maximum phase range of the linear phase shifter, undesirably causing the PLL to unlock. Alternatively, linear phase shifters can be reset to zero degrees when a phase shift of 360 degrees is reached; however, such a reset results in a discontinuity in the phase lock leading to unstable operation of the phase locked loop as it must re-acquire lock at the new setting of the phase shifter. The re-acquisition after phase resetting introduces a phase and frequency transient into the higher level system which will result in degradation of the system performance to an impractical level.

Figure 4:
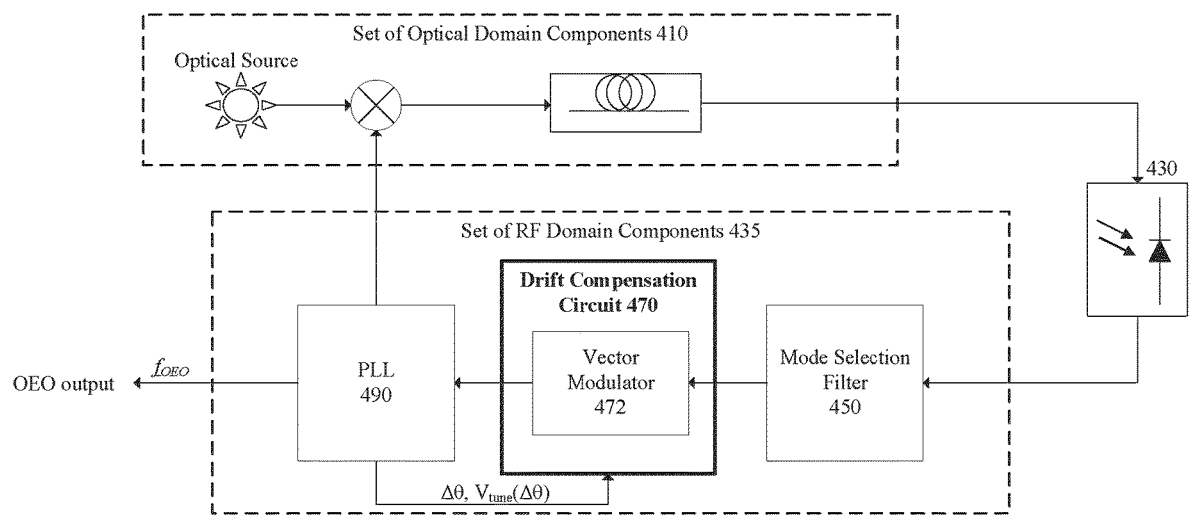
FIG. 4 illustrates an OEO embodiment according to FIG. 3, further comprising a vector modulator according to the present disclosure.

FIG. 4 illustrates an OEO 400 according to an embodiment of the present disclosure. OEO 400 is substantially similar to OEO 300 illustrated in FIG. 3, and further includes a vector modulator 472 configured to provide vector-based phase modulation. As illustrated in the embodiment of FIG. 4, the set of RF domain components 435 comprise a mode selection filter 450, a PLL 490, and a drift compensation circuit 470 communicatively coupled between the mode selection filter 450 and the PLL 490. The mode selection filter 450 is configured to receive an output of the set of optical domain components 410 and provide a mode selection result to the drift compensation circuit. In an embodiment, the mode selection result is an isolated oscillatory mode.

In the embodiment of FIG. 4, the drift compensation circuit 470 comprises a vector modulator 472 configured to phase modulate the mode selection result in a vector-based coordinate system, based on a stored total phase drift, for providing a drift compensated mode selection result to the PLL 490. The PLL 490 is configured to detect a phase difference $\Delta\theta$ between the drift compensated mode selection result and a local oscillator signal, for use in maintaining the PLL 490 in a phase lock with the local oscillator signal. In an embodiment, the detected phase difference $\Delta\theta$ is converted into a control voltage $V_{tune}$ proportional to the detected phase difference $V_{tune}(\Delta\theta)$, which is used to servo the phase shift element present in PLL 490. In an embodiment, the phase shift element is a phase shifter, such as a linear phase shifter. The drift compensation circuit 470 is further configured to update, determine, or obtain the total phase drift based on the detected phase difference $\Delta\theta$ determined by the PLL 490. In an embodiment, the total phase drift is based on a digitized control voltage $V_{tune}$ proportional to the detected phase difference $V_{tune}(\Delta\theta)$ determined by the PLL 490. In an embodiment, a downconverter 430 such as a photodiode, is provided to convert the optical domain output to an RF band.

Figure 5A:
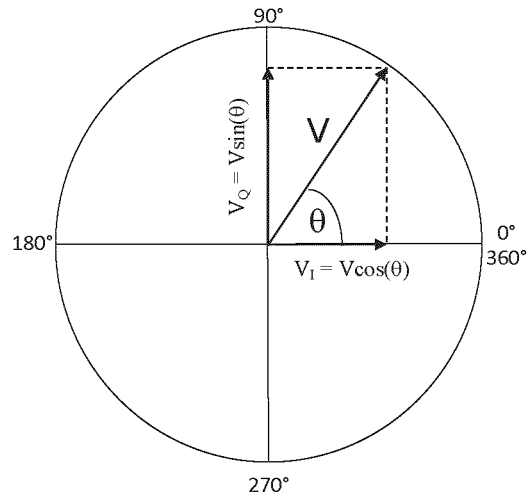
FIG. 5A illustrates phase modulation in a vector-based coordinate system, using an OEO according to an embodiment of the present disclosure.

FIG. 5A illustrates vector based phase modulation as used for example by an OEO according to an embodiment of the present disclosure. In an example embodiment, the OEO comprises a vector modulator having a maximum modulator gain V for use in determining an in-phase vector and a quadrature vector. The in-phase vector $V_I$ and quadrature vector $V_Q$ are orthogonal composites of a vector defined by modulator gain V and the stored total phase drift $\theta$. As illustrated in FIG. 5A, the vectors are based on a vector coordinate system, wrapping every 360 degrees, enabling infinite phase tracking and correction. As an illustrative example, the same respective in-phase vector and quadrature vectors will results from $\theta$ values of 45°, 405°, 765°, 1125°.

In the example implementation, the in-phase and quadrature vectors $V_I$ and $V_Q$, respectively, are expressed as voltages. The in-phase voltage $V_I$ is based on the cosine function of the stored total phase drift $\theta$, multiplied by the maximum modulator gain V. Similarly, the quadrature voltage $V_Q$ is based on the sine function of the stored total phase drift $\theta$, multiplied by the maximum modulator gain V. In an embodiment, the phase difference $\Delta\theta$ is provided as a tuning voltage $V_{tune}$ and the stored total phase drift $\theta$ is updated based on the tuning voltage $V_{tune}$ and a degree-to-voltage constant $K_\theta$.

In an embodiment, vector-based phase modulation includes mixing the mode selection result in-phase with an in-phase component of the total phase drift; and mixing the mode selection result in quadrature, with a quadrature component of the stored total phase drift. In the example implementation illustrated in FIG. 5A, the in-phase component of the stored total phase drift $\theta$ is the in-phase vector $V_I$; and the quadrature component of the stored total phase drift $\theta$ is the quadrature vector $V_Q$.

FIG. 5B is a series of steps for converging a phase shifter towards a phase offset according to an embodiment herein. Starting with step 510, a slope variable (Slope) for a phase shifter, such as a phase shifter used in a PLL according to an embodiment herein, is set to a default slope value ($Slope_{Default}$). In an embodiment, $Slope_{Default}$ is a default calibration value based on the type of phase shifter. In an embodiment, $Slope_{Default}$ is based on the voltage midpoint ($V_{tuneMID}$) of the phase shifter, at room temperature.

Step 520 reads a tuning voltage ($V_{tune}$) provided to the phase shifter and a drift compensation circuit. In an embodiment, tuning voltage $V_{tune}$ is based on a phase difference $\Delta\theta$ detected between an output of the drift compensation circuit and a local reference signal.

Step 530 determines whether the tuning voltage $V_{tune}$ is close to a midpoint voltage $V_{tuneMID}$ of the phase shifter. If the voltages are similar, an update flag (Update_Flag) is further checked to determine if there has been a previous slope update. If Update_Flag is set to True, an update has previously occurred and the convergence algorithm proceeds to step 550. If Update_Flag is set to False, the convergence algorithm proceeds to step 540, to update the slope variable. In an embodiment, the default setting for Update_Flag is False.

Update slope 540 comprises a series of steps 541-547 for updating the slope calibration value Slope, based on a desired phase offset $\theta_{offset}$. In an embodiment, the phase offset $\theta_{offset}$ is 20 degrees. At a time zero epoch $t_0$, Step 541 includes reading the tuning voltage $V_{tune}$ into a time zero voltage reading $V_{t0}$. Step 542 updates the phase $\theta$ based on a phase offset $\theta_{offset}$. Step 543 updates the in-phase and quadrature voltages $V_I$ and $V_Q$, respectively, based on the phase calculated in step 542. In an embodiment, the in-phase voltage $V_I$ is based on a maximum voltage gain V and the cosine of phase $\theta$; and, the quadrature voltage $V_Q$ is based on a maximum voltage gain V and the sine of phase $\theta$. In an embodiment the in-phase and quadrature voltages $V_I$ and $V_Q$ are output by digital-to-analog converters (DACs), as inputs to a vector modulator, for use in phase modulating a signal in a vector based coordinate system. In an embodiment, the in-phase voltage and quadrature voltage $V_I$ and $V_Q$ are in the range of 0 and 1.5 volts.

Step 544 involves a time delay $T_{delay}$ for the system to progress to a subsequent time epoch $t_1$ followed by step 545 where tuning voltage $V_{tune}$ is read into the subsequent time epoch tuning voltage $V_{t1}$. In an embodiment, $T_{delay}$ is at least five times larger than a time constant of a PLL loop filter controlling the phase shifter. Step 546 involves re-calibrating the slope based on the dividing phase offset $\theta_{offset}$ by the difference in tuning voltages $V_{t0}$-$V_{t1}$. The slope calibration thus reflects a ratio between the phase offset $\theta_{offset}$ and the change in tuning voltage ($V_{t0}$-$V_{t1}$) required to converge towards the phase offset $\theta_{offset}$. Step 547 completes the Update Slope function 540, by setting Update_Flag to True.

Steps 550 determines the current phase $\theta$ based on adding to the previous phase $\theta'$: the division of the difference between the phase shifter midpoint voltage $V_{tuneMID}$ and the tuning voltage $V_{tune}$, by the multiplication of the slope value Slope and a damping constant $K_{damping}$. As this step is repeated over time, the phase shifter will converge to maintain a phase lock, biased at a phase offset $\theta_{offset}$.

Step 560 updates the in-phase and quadrature voltages $V_I$ and $V_Q$, respectively, based on the phase $\theta$ calculated in step 550. In an embodiment, the in-phase voltage $V_I$ is based on a maximum voltage gain V and the cosine of phase $\theta$; and, the quadrature voltage $V_Q$ is based on a maximum voltage gain V and the sine of phase $\theta$. In an embodiment the in-phase and quadrature voltages $V_I$ and $V_Q$ are output by digital-to-analog converters (DACs), as inputs to a vector modulator, for use in phase modulating a signal in a vector based coordinate system In an embodiment, the in-phase voltage and quadrature voltage $V_I$ and $V_Q$ are in the range of 0 and 1.5 volts.

Figure 6:
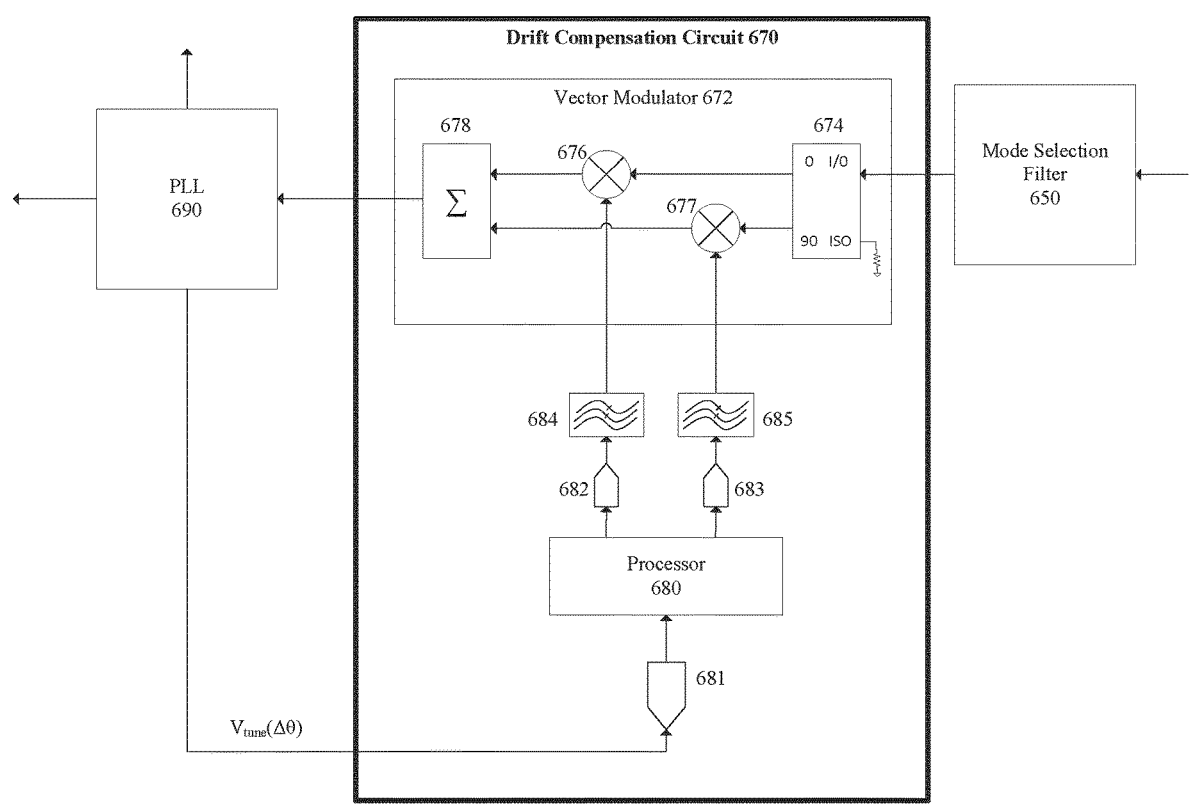
FIG. 6 illustrates an embodiment of a drift compensation circuiting comprising a vector modulator and a processor according to the present disclosure.

Lastly, step 570 provides a time delay $T_{delay}$ for the system to progress to a subsequent time epoch, thereby returning to step 530, to repeat the above described steps. In an embodiment, $T_{delay}$ is at least five times larger than a time constant of a PLL loop filter controlling the phase shifter FIG. 6 illustrates a drift compensation circuit 670 according to an embodiment of the present disclosure, for example for use in an OEO such as shown in FIG. 3 and FIG. 4. The drift compensation circuit 670 is communicatively coupled between a mode selection filter 650 and a PLL 690. The drift compensation circuit 670 includes a vector modulator 672 comprising a hybrid coupler 674, an in-phase mixer 676, a quadrature mixer 677, and a signal combiner 678. The drift compensation circuit 670 further includes an analog-to-digital converter (ADC) 681, processor 680, an in-phase digital-to-analog converter (I_DAC) 682, a quadrature digital-to-analog converter (Q_DAC) 683, and a pair of low pass filters, 684 and 685. In an embodiment, the processor 680 is a microprocessor.

The vector modulator 672 is configured to receive a mode selection result from the mode selection filter 650. In the example implementation illustrated in FIG. 6, the vector modulator comprises a hybrid coupler 674 configured to receive the mode selection result and provide an in-phase mode selection result at the in-phase output of the hybrid coupler 674; and a quadrature mode selection result at the quadrature output of the hybrid coupler 674. Accordingly, the hybrid coupler 674 outputs the in-phase mode selection result to the in-phase mixer 676 and, outputs the quadrature mode selection result to the quadrature mixer 677.

In an embodiment, the processor 680 stores and updates the total phase drift of the OEO. In the example implementation illustrated in FIG. 6, the detected phase difference $\Delta\theta$ received from the PLL is expressed as a tuning voltage $V_{tune}$ proportional to the detected phase difference $V_{tune}(\Delta\theta)$, further provided to the ADC 681. The ADC 681 is configured to provide a sampled output of the detected tuning voltage, $V_{tune}(\Delta\theta)$, to the processor 680 for use in updating the stored total phase drift. In an embodiment, the stored total phase drift is updated based on the tuning voltage and a degrees-to-voltage constant $K_\theta$. The processor 680 further determines the in-phase component of the stored total phase drift for output to the I_DAC 682; and further determines the quadrature component of the stored total phase drift for output to the Q_DAC 683.

In the example implementation illustrated in FIG. 6, the digital-to-analog converters 682 and 683 are coupled to an in-phase low pass filter 684 and a quadrature low pass filter 685, respectively. The low pass filters 684 and 685 convert the in-phase and quadrature components of the stored total phase drift, to DC, for input to the in-phase mixer 676 and the quadrature mixer 677, respectively.

In the embodiment illustrated in FIG. 6, vector-based modulation comprises, or is enabled based on, mixing the mode selection result and the total phase drift using in-phase and quadrature composites. In an example embodiment, the in-phase mixer 676 is configured to receive, the mode selection result in-phase and the in-phase component of the total phase drift, as inputs, respectively from the hybrid coupler 674 and the in-phase low pass filter 684, for outputting an in-phase drift compensated mode selection result. In an example embodiment, the quadrature phase mixer 677 is configured to receive, the mode selection result in quadrature and the quadrature component of the total phase drift, as inputs, respectively from the hybrid coupler 674 and the quadrature low pass filter 685, for outputting the quadrature drift compensated mode selection result. Signal combiner 678 is configured to receive the in-phase drift compensated mode selection result and the quadrature drift compensated mode selection result, for outputting a drift compensated mode selection result to the PLL 690.

Figure 7A:
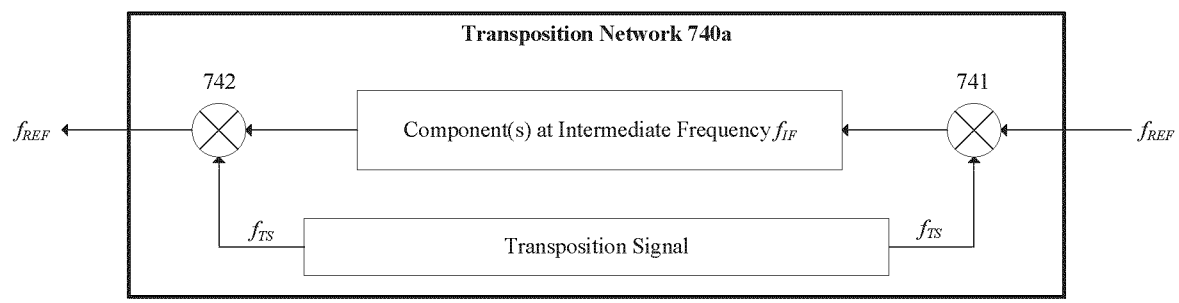
FIGS. 7A and 7B illustrate embodiments of a transposition network for transposing to an intermediate frequency according to the present disclosure.
Figure 7B:
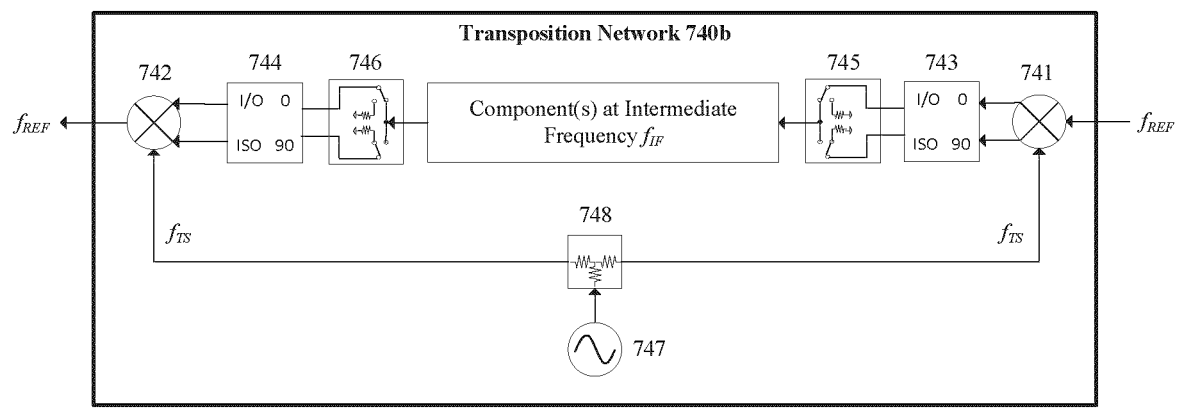

FIGS. 7A and 7B illustrate embodiments of a transposition network 740a and 740b, configured for transposing a component or set of components—such as a mode selection filter, drift compensation circuit, or PLL according to an embodiment of the present disclosure—to an intermediate frequency (IF). Frequency transposition provides the advantage of transposing wide broadband inputs to fixed frequency components using a transposition signal. Embodiments of the present disclosure include receiving broadband input signals between about 1 GHz and about 40 GHz; between about 8 GHz and about 12 GHz; and less than 1 GHz. The relationship of the transposition networks in FIGS. 7A and 7B to the other elements of an OEO according to embodiments of the present disclosure will be described later, and in further detail, in relation to FIGS. 8A, 8B, 8C and 8D.

FIG. 7A illustrates a transposition network 740a comprising a pair of mixers 741 and 742 configured to receive a transposition signal for transposing to an intermediate frequency $f_{IF}$ of a component coupled between the mixers 741 and 742. An input mixer 741 is configured to receive a reference signal at a reference frequency $f_{REF}$, and a transposition signal at a transposition frequency $f_{TS}$, as inputs. In an embodiment, the input mixer 741 transposes the reference signal to an intermediate frequency $f_{IF}$ based on a difference between the reference frequency $f_{REF}$ and the transposition frequency $f_{TS}$. In an embodiment, the transposition frequency $f_{TS}$ may be tuned to transpose the reference signal to a desired intermediate frequency $f_{IF}$, such as a fixed frequency of a component or set of components, including a mode selection filter, drift compensation circuit, or PLL in accordance with the present disclosure. The output of the component or set of components is provided to an output mixer 742, for upconversion to the reference frequency $f_{REF}$, based on transposition with the transposition signal.

FIG. 7B illustrate a transposition network 740b comprising an input mixer 741, input hybrid coupler 743, an output hybrid coupler 744, an input sideband switch 745, an output sideband switch 746, and a component or set of components, coupled between the sideband switches 745 and 746. In the example implementation illustrated in FIG. 7B, input mixer 741 and output mixer 742 are image rejection mixers. The transposition network 740b further includes a signal generator 747 for generating a transposition signal at a transposition frequency $f_{TS}$, and a power splitter 748 for coupling the transposition signal to the input mixer 741 and the output mixer 742. Similar to transposition network 740a, transposition network 740b uses the transposition signal to transpose down to an intermediate frequency $f_{IF}$ from a reference frequency $f_{REF}$; transpose up to the REF reference frequency $f_{REF}$ from the intermediate frequency $f_{IF}$. In an embodiment, the input hybrid coupler 743 and the input sideband switch 745 are co-operable to select an RF sideband of an output of input mixer 741; and the output hybrid coupler 744 and the output sideband switch 746 are co-operable to select an RF sideband of an input to output mixer 742.

FIGS. 8A-8D illustrate various configurations of an OEO implementing a transposition network, such as transposition networks 740a or 740b, according to an embodiment of the present disclosure. In an embodiment, frequency transposition may be provided to a single component in the set of RF domain components, including the mode selection filter, drift compensation circuit, and PLL. In an embodiment, frequency transposition is provided to two or more components in the set of RF domain components.

Figure 8A:
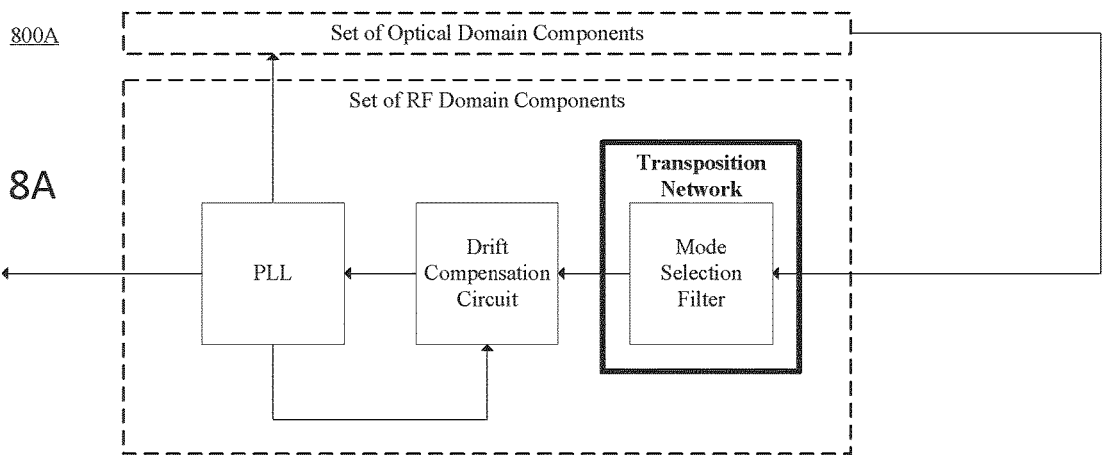
FIGS. 8A-8D illustrate embodiments of OEOs comprising component(s) of the set of RF domain components transposed to an intermediate frequency according to the present disclosure.
Figure 8B:
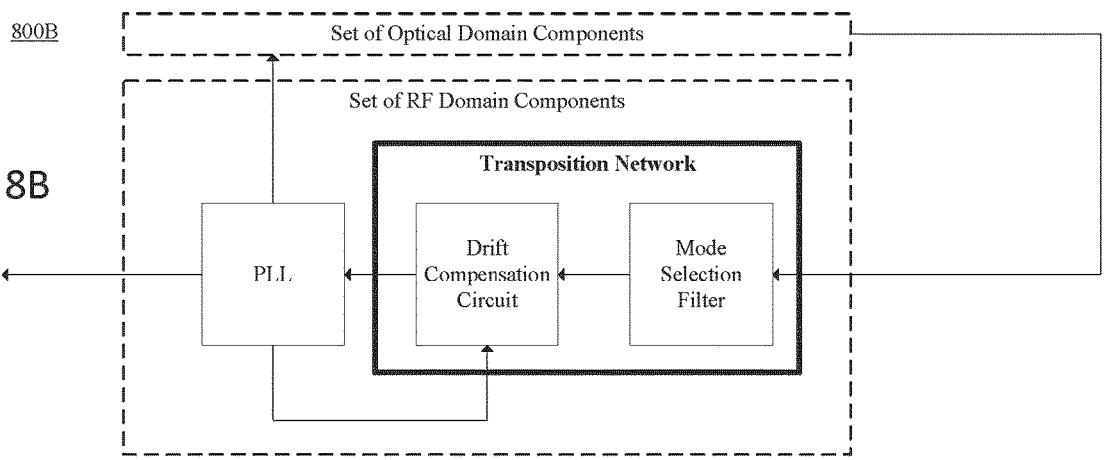
Figure 8C:
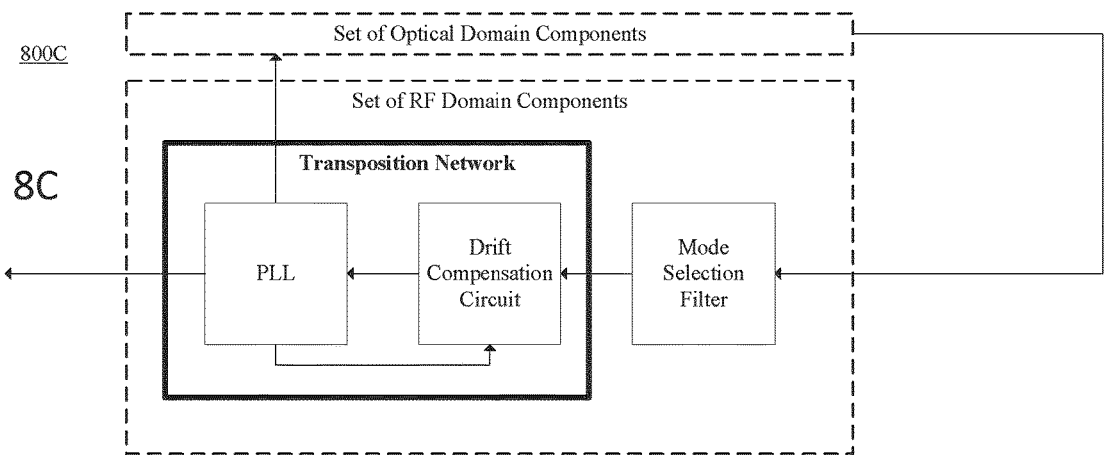
Figure 8D:
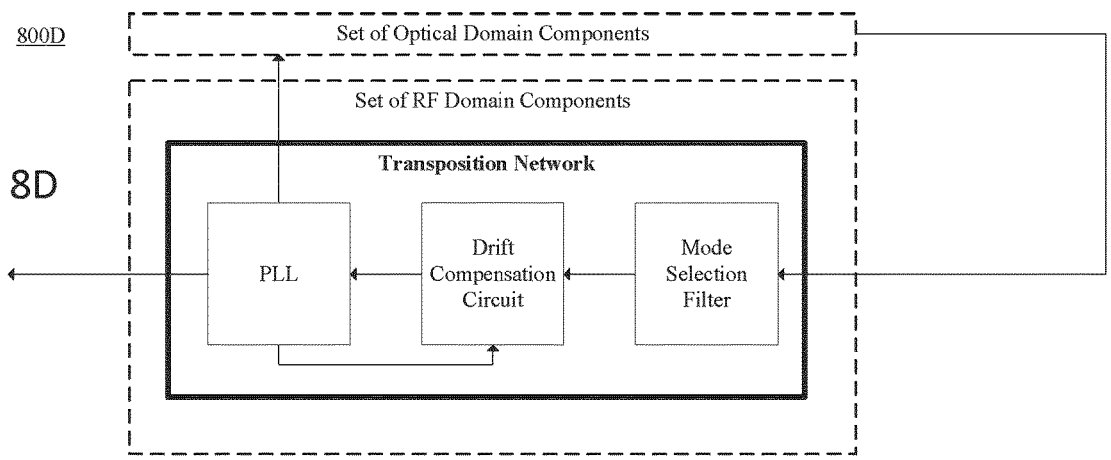

In particular, FIG. 8A illustrates an OEO 800A wherein the mode selection filter is transposed to an intermediate frequency using a transposition network according to an embodiment of the present disclosure. FIG. 8B illustrates an OEO 800B wherein the mode selection filter and the drift compensation circuit are transposed to an intermediate frequency using a transposition network according to an embodiment of the present disclosure. FIG. 8C illustrates an OEO 800C wherein the drift compensation circuit and the PLL are transposed to an intermediate frequency using a transposition network according to an embodiment of the present disclosure. FIG. 8D illustrates an OEO 800D wherein the mode selection filter, the drift compensation circuit, and the PLL are transposed to an intermediate frequency using a transposition network according to an embodiment of the present disclosure. Other embodiments may include additional components and/or combinations of components provided at an intermediate frequency within a transposition network according to the present disclosure.

FIG. 9 illustrates a fixed frequency drift compensation circuit 970 according to the present disclosure. In an example embodiment, the fixed frequency drift compensation circuit is a drift compensation circuit, such as drift compensation circuits 370, 470, and 670. In the implementation illustrated in FIG. 9, the drift compensation circuit 970 further comprises a fixed frequency vector modulator 972 according to the present disclosure, for example including vector modulators 472 and 672. FIG. 9 further illustrates a transposition network comprising: input and output mixers 941 and 942, input and output hybrid couplers 943 and 944, input and output band pass filters 949a and 949b, and a local oscillator 996 for generating a local oscillator signal. The input and output hybrid couplers 943 and 944 provide switching between two sideband modes. The local oscillator signal is provided to PLL 990 and the transposition synthesizer. The transposition synthesizer is configured to generate the transposition signal, based on the local oscillator signal. In an embodiment, a power splitter 948 couples the transposition signal to each of the input mixer 941 and the output mixer 942.

Figure 10A:
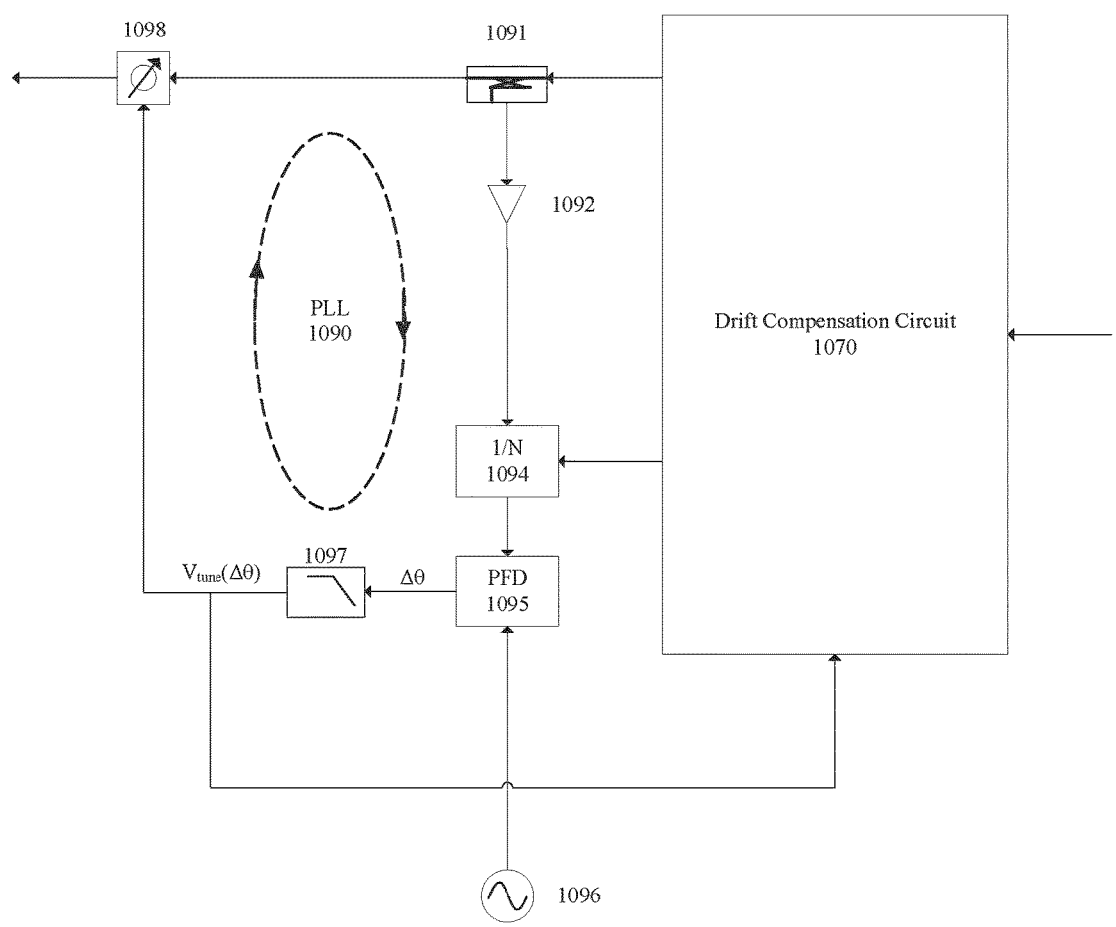
FIG. 10A illustrates an embodiment of a phase locked loop (PLL) implemented in an OEO according to the present disclosure.

FIG. 10A illustrates a PLL 1090 according to an embodiment of the present disclosure, for example, for use in an OEO such as an OEO shown in FIGS. 3, 4, 6, and 8-9. The PLL comprises a coupler 1091, gain element 1092, frequency divider 1094, phase frequency detector (PFD) 1095, local oscillator 1096, low pass filter (LPF) 1097, and phase shifter 1098.

The drift compensation circuit 1070 provides a drift compensated output, adjusted based on a stored total phase drift, such as phase drift which accumulates in the operation of an OEO. Correcting phase drift prior to the PLL 1090 maintains the drift compensated output within a locking bandwidth of the PLL 1090. In an embodiment, the drift compensated output is a drift compensated mode selection result generated based on a mode selection result generated by a mode selection filter as disclosed herein. The drift compensated output of the drift compensation circuit 1070 is coupled to each of phase shifter 1098 and gain element 1092, via a coupler 1091. In an embodiment, gain element 1092 is an amplifier, such as a Silicon Germanium (SiGe) amplifier. The output of the gain element 1092 is provided to a frequency divider 1094. In an embodiment, frequency divider 1094 steps a drift compensated output of the drift compensation circuit 1070 down to a local master reference frequency of the local oscillator 1096. In an embodiment, the drift compensation circuit 1070 adjusts a factor N of frequency divider 1094, for use in dividing the drift compensated output of the drift compensation circuit 1070 down to a local master reference frequency of the local oscillator 1096.

PFD 1095 is configured to detect a phase difference $\Delta\theta$ between the drift compensated output of the drift compensation circuit 1070 and the local reference signal generated by the local oscillator 1096. As the drift compensation circuit 1070 provides infinite phase correction based on a stored total phase drift, PLL 1090 only detects temporarily unaccounted for, incremental phase shifts. However, such finite phase shifts will be within a Iphase range of phase shifter 1098, and subsequently corrected by the drift compensation circuit 1070 once PLL 1090 provides the detected phase difference $\Delta\theta$, to the drift compensation circuit 1070. In an embodiment, the detected phase difference $\Delta\theta$ is provided as a tuning voltage $V_{tune}$ proportional to the detected phase difference $V_{tune}(\Delta\theta)$. Accordingly, the output of the PFD 1095 will be based on incremental phase changes, constraining an output of the PFD to a finite range. In an embodiment, the detected phase difference $\Delta\theta$, generated by PFD 1095, is within a phase range of phase shifter 1098. The output $\Delta\theta$ of the PFD 1095 is further provided to LPF 1097 and to the drift compensation circuit 1070 for use in updating the stored total phase drift of the system. In an embodiment, LPF 1097 filters phase noise from the PLL circuit above 5 kHz.

Phase shifter 1098 receives the drift compensated output of the drift compensation circuit 1070 and locks it to a reference signal generated by local oscillator 1096. In an embodiment, maintaining the PLL in a phase lock with the reference signal comprises adjusting a phase of the drift compensated output based on a detected phase difference $\Delta\theta$. In an embodiment, the output of phase shifter 1098 feeds back to an input of a set of optical domain components. In an embodiment, the output of the OEO is the output of phase shifter 1098, provided at an OEO output frequency in an RF band. In an embodiment, the phase shifter output is phase locked to the reference signal generated by the local oscillator 1096. In an embodiment, phase shifter 1098 is a linear phase shifter having a phase range less than 400 degrees.

A PLL according to the present disclosure is not limited to each and every element illustrated in FIG. 10. Persons skilled in the art will appreciate that some features may be omitted while other features may be added. In an embodiment, a PLL according to the present disclosure comprises a phase frequency detector, a phase shifter, and a low pass filter coupled between the phase frequency detector and the phase shifter.

Figure 10B:
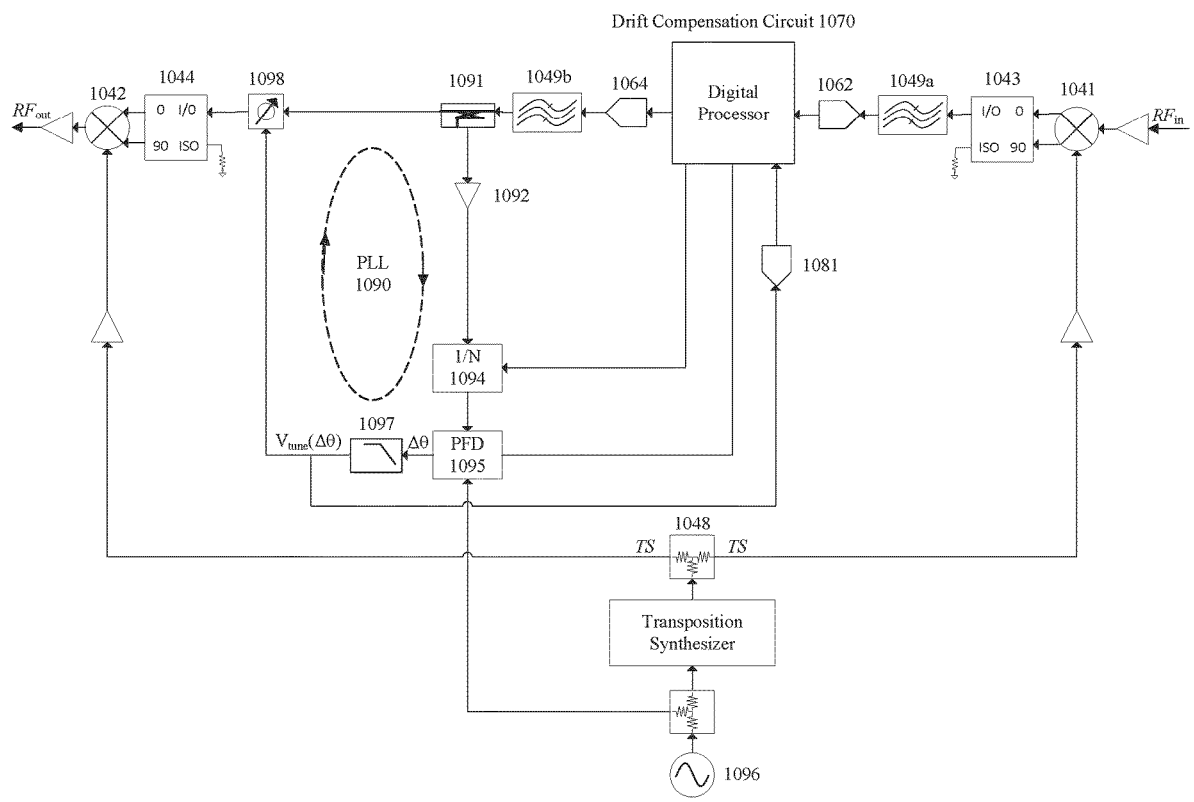
FIG. 10B illustrates the PLL of FIG. 10A and a drift compensation circuit according to an embodiment herein, transposed to an intermediate frequency.

FIG. 10B illustrates an embodiment according to FIG. 10A where PLL 1090 and drift compensation circuit 1070 are coupled to a transposition network for operation at an intermediate frequency. At an input end of the transposition network, an input signal $RF_{in}$ having a frequency in a radio frequency (RF) band, is provided as an input to input mixer 1041 for transposition to an intermediate frequency with transposition signal TS. In an embodiment, $RF_{in}$ is a mode selection result, such as a mode selection result generated by a mode selection filter according to an embodiment herein. At an output end of the transposition network, an output signal $RF_{out}$ having a frequency in a RF band, is generated based on output mixer 1042 transposing the output of PLL 1090 with transposition signal TS. In an embodiment, the output of PLL 1090 is provided by the output of phase shifter 1098 further transmitted through hybrid coupler 1044. In an embodiment, $RF_{out}$ is provided as the output for an OEO as disclosed herein. In an embodiment, $RF_{out}$ is coupled to an input of a set of optical domain components.

In the illustrative embodiment of FIG. 10B, drift compensation circuit 1070 is implemented on a digital processor coupled between an input analog-to-digital converter (IP_ADC) 1062 and an output digital-to-analog converter (OP_DAC) 1064. IP_ADC 1062 receives input signal $RF_{in}$ having been transposed to an intermediate frequency and transmitted through hybrid coupler 1043 and input filter 1049a. Drift compensation circuit 1070 thus receives a digitized version of $RF_{in}$ based on an output of IP_ADC 1062. Drift compensation circuit 1070 provides a drift compensated output based on phase modulating the digitized $RF_{in}$ signal in a vector based coordinate system as disclosed herein. As disclosed in other embodiments herein, vector based phase modulation makes use of a stored total phase drift, accumulated from incremental phase differences Δθ detected by PLL 1090 that are further provided as feedback to drift compensation circuit 1070. In an embodiment, the detected phase difference Δθ is provided as a digitized tuning voltage $V_{tune}(\Delta\theta)$ to drift compensation circuit 1070 using analog-to-digital converter (ADC) 1081. The drift compensated output is provided to OP_DAC 1064 for conversion back to an analog signal, for transmission to output filter 1049b, and subsequently to PLL 1090, for use in maintaining a phase lock with a reference signal generated by local oscillator 1096 as disclosed in embodiments herein. In an embodiment, drift compensation circuit 1070 is configured to introduce a phase offset $\theta_{offset}$, for causing PLL 1090 to maintain a phase lock, biased by the phase offset $\theta_{offset}$.

Frequency transposition advantageously enables PLL 1090 to operate frequency divider 1094 at a lower N value. In the case where the intermediate frequency matches a frequency of the local oscillatory, PLL 1090 operates at unity. In an embodiment, frequency divider 1094 sets the value N based on a control signal received from drift compensation circuit 1070.

Figure 11:
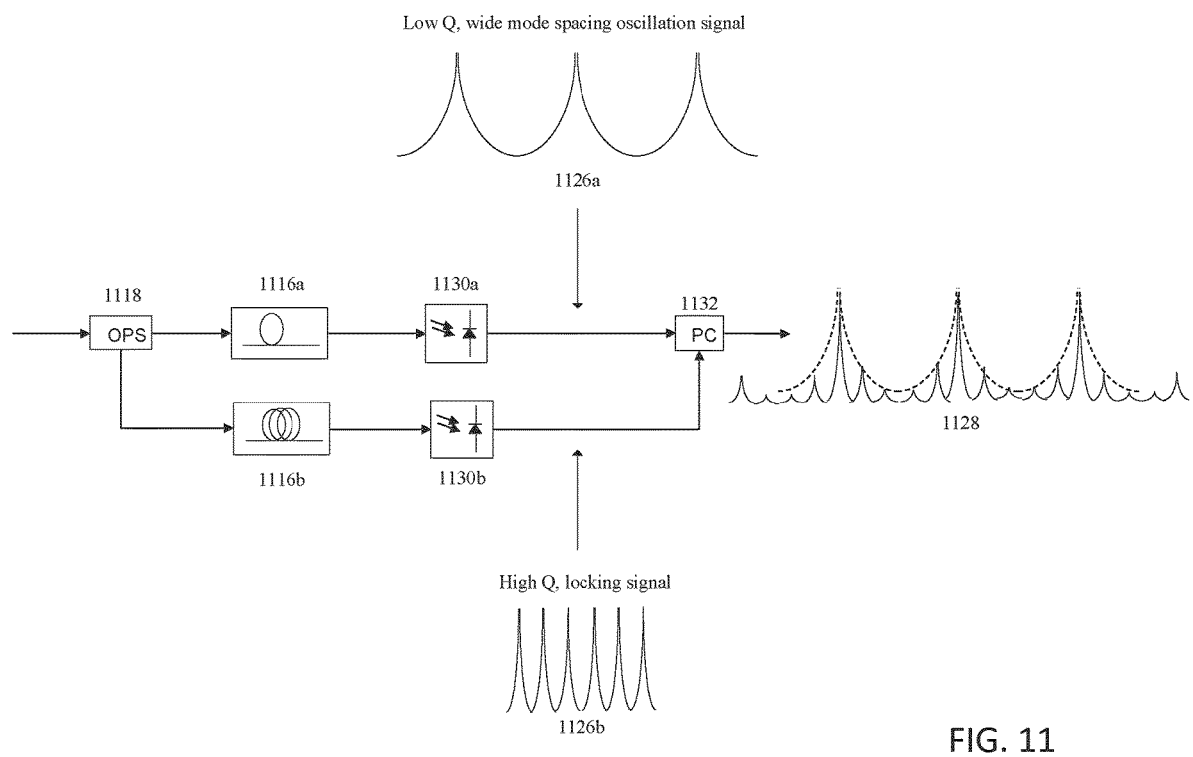
FIG. 11 illustrates an embodiment of an optical delay line comprising two optical delay lines of different lengths.

FIG. 11 illustrates an optical delay line for use in an OEO according to an embodiment of the present disclosure. The optical delay line illustrated in FIG. 11 comprises an optical power splitter (OPS) 1118, a short optical delay line 1116a, and a long optical delay line 1116b. The OPS 1118 is configured to split an optical signal source for transmission along the short optical delay line 1116a having a first length; and, transmission along the long optical delay line 1116b having a second length greater than the first length. In an embodiment, the optical power splitter splits the optical signal source into a first optical signal and a second optical signal, for transmission on respective first and second optical delay lines. In the example implementation illustrated in FIG. 11, the first length of the short optical delay line 1116a is selected to produce a wide mode spacing oscillation signal 1126a having a relatively low Q factor, and the second length of the long optical delay line 1116b is selected to produce a low phase noise, high Q factor locking signal 1126b. In an embodiment, the short optical delay line 1116a has a first length of 50 m corresponding to a mode spacing of 4 MHz, and the long optical delay line 1116b has a second length of 5 km corresponding to a mode spacing of 40 kHz.

A downconverter 1130a and 1130b, such as a photodiode, couples to the output of each optical delay line 1126a and 1126b. The photodiodes 1130a and 1130b convert the optical domain outputs of the delay lines 1126a and 1126b to an RF band for transmission to a set of RF domain components according to embodiments of the present disclosure. In an embodiment, a microwave power combiner 1132 is configured to couple the outputs of photodiodes 1130a and 1130b for generating a low phase noise and wide mode spacing signal 1128. The resulting signal 1128 advantageously exhibits the enhanced characteristics of each respective delay line signal 1126a and 1126b. In an embodiment, an optical combiner is configured to couple the output of each of the delay lines 1126a and 1126b, the combined output for subsequent input to a downconverter, such as a photodiode.

Figure 12:
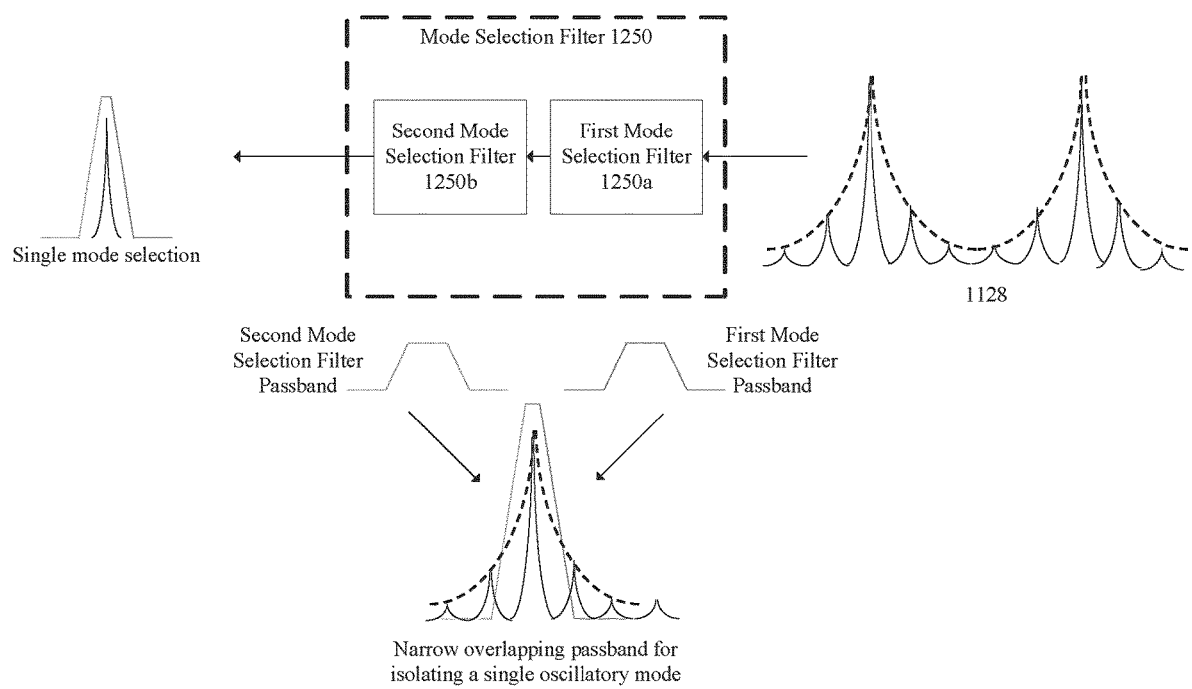
FIG. 12 illustrates an embodiment of a mode selection filter comprising a first and second mode selection filter having overlapping passbands for isolating an oscillatory mode.

FIG. 12 illustrates an embodiment of a mode selection filter 1250 for use in an OEO according to the present disclosure. In the example implementation illustrated in FIG. 12, mode selection filter 1250 comprises a first mode selection filter 1250a having a first passband, and a second mode selection filter 1250b having a second passband overlapping the first passband. Embodiments of mode selection filters 1250a and 1250b include passband filters, SAW filters, dispersive SAW filters and electronically tunable filters (ETF).

Mode selection filter 1250 enables isolation of a single oscillatory mode. In the embodiment illustrated in FIG. 12, respective passbands of the first and second mode selection filters 1250a and 1250b are configured to overlap, and define, an overlapping passband, configured to isolate a single oscillatory mode. By adjusting an offset between the first and second mode selection filter passbands, the overlapping passband can be adjusted to a desired bandwidth for a desired oscillatory mode. In this manner, the bandwidth of the overlapping passband can be modified without individually adjusting the bandwidth of the first and second mode selection filter bandwidths. This enables maintaining wide bandwidths across each mode selection filter 1250a and 1250b, while also allowing for isolation of a single oscillatory mode across a narrow overlapping passband.

In an embodiment, the first mode selection filter 1250a has a first mode selection filter passband for filtering a received RF signal, such as a high Q factor wide mode spacing signal 1128 generated by an optical delay line according to FIG. 11. Similarly, the second mode selection filter 1250b has a second mode selection filter passband for filtering an output of the first mode selection filter 1250a. In this manner, the first and second mode selection filters 1250a and 1250b co-operably define an overlapping passband for generating a mode selection result having a frequency response including isolation of a single oscillatory mode. In an embodiment, the first and second mode selection filter passbands are configured to define an overlapping passband based on overlap between the first and second mode selection filter passbands. In an embodiment, the overlapping passband enables isolation of a single oscillatory mode.

The first and second mode selection filter passbands can maintain relatively wide passbands while also defining a narrow overlapping passband based on adjusting a frequency spacing between the first and second mode selection filter passbands. In an embodiment, the overlapping passband is based on a frequency spacing between the first and second mode selection filter passbands. In an embodiment, the first mode selection filter has a first mode selection filter center frequency, the second mode selection filter has a second mode selection filter center frequency, and the frequency spacing is based on a difference between the first and second mode selection filter center frequencies. In an embodiment, the frequency spacing between the first and second mode selection filter passbands is adjusted to define an overlapping passband configured to isolate a single oscillatory mode.

Figure 13:
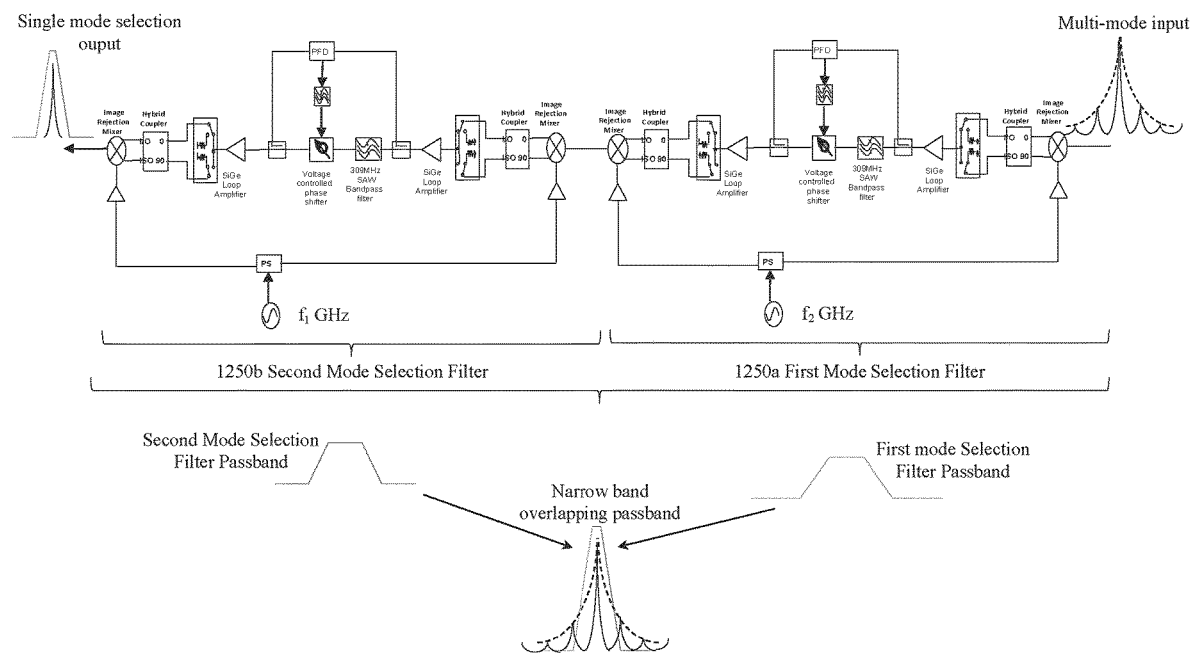
FIG. 13 illustrates an embodiment of a mode selection filter comprising a first and second mode selection filter transposed to an intermediate frequency and coupled to a phase noise suppression loop.

FIG. 13 illustrates a further embodiment of a mode selection filter 1250, comprising a first mode selection filter 1250*a* and a second mode selection filter 1250*b*. In the example implementation illustrated in FIG. 13, each mode selection filter 1250*a* and 1250*b* is provided at an intermediate frequency using frequency transposition according to the present disclosure.

In addition to the foregoing, other aspects of mode selection and mode selection filters as disclosed in Applicant's related U.S. patent application Ser. No. 15/752,797 entitled OPTOELECTRONIC OSCILLATOR WITH TUNABLE FILTER, are herein incorporated by reference.

The preceding description generally describes a drift compensation circuit for use in an OEO as described herein. However, a drift compensation circuit as disclosed herein is not so limited to use with an OEO. Any system which may be limited by the operational capacities of linear phase shifters, or other systems which may otherwise benefit from infinite phase correction could implement an infinite phase shifter in accordance with FIG. 14 and other embodiments as described herein.

Figure 14:
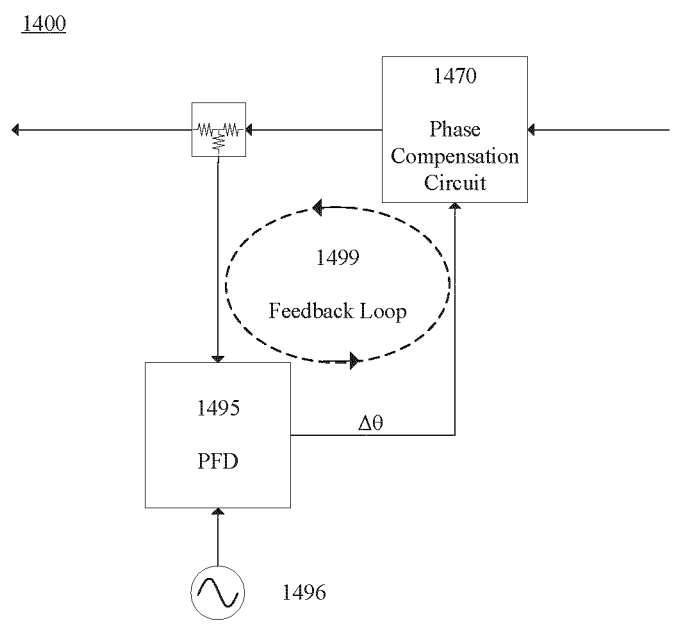
FIG. 14 illustrates an embodiment of an infinite phase shifter based on a drift compensation circuit according to an embodiment disclosed herein.

FIG. 14 illustrates an infinite phase shifter 1400 based on a phase compensation circuit 1470 coupled with phase frequency detector (PFD) 1495 in a feedback loop 1499. Phase compensation circuit 1470 is substantively the same as the drift compensation circuits disclosed herein. In the illustrative example of FIG. 14, phase compensation circuit 1470 maintains a phase lock with a reference signal provided to PFD 1495, such as a local reference signal generated by local oscillator 1496. In this manner, drift compensation circuit 1470 maintains a phase lock with the reference signal generated by local oscillator 1496 as phase compensation circuit 1470 can continuously track and update a total phase shift of the input signal based on a phase differences Δθ detected by PFD 1495. As described in embodiments herein, phase compensation circuit 1470 employs vector based modulation to provide infinite phase correction, thereby functioning as an infinite phase shifter. Applications which may benefit from infinite phase correction—and other improvements as disclosed herein such as maintaining a phase lock at a phase offset—include butler matrices and power amplifier combining systems.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. An optoelectronic oscillator (OEO), comprising:
a set of optical domain components;
a downconverter in communication with an output of the set of optical domain components;
a set of radio frequency (RF) domain components in communication with an output of the downconverter, the set of RF domain components including:
a mode selection filter in communication with the output of the downconverter, the mode selection filter configured to output a mode selection result;
a drift compensation circuit configured to receive the mode selection result from the mode selection filter and to phase modulate the mode selection result, based on a stored total phase drift, in a vector based coordinate system, for outputting a drift compensated mode selection result; and
a phase locked loop (PLL) in communication with the drift compensation circuit, the PLL configured to detect a phase difference between a local oscillator signal and the drift compensated mode selection result for use in maintaining the PLL in a phase lock with the local oscillator signal, an output of the PLL being coupled to an input of the set of optical domain components, and
the drift compensation circuit being configured to:
receive the detected phase difference from the PLL; and
update the stored total phase drift based on the received detected phase difference, for use in maintaining the drift compensated mode selection result within a locking bandwidth of the PLL.

2. The OEO of claim 1, wherein the drift compensation circuit further comprises:
a vector modulator configured to generate the drift compensated mode selection result, based on:
mixing the mode selection result in-phase, with an in-phase component of the stored total phase drift, and
mixing the mode selection result in quadrature, with a quadrature component of the stored total phase drift.

3. The OEO of claim 2, wherein the vector modulator further comprises:
a hybrid coupler configured to receive the mode selection result and provide the mode selection result in-phase and the mode selection result in quadrature.

4. The OEO of claim 3, wherein the vector modulator further comprises:
an in-phase image rejection mixer configured to receive the mode selection result in-phase, for mixing with the in-phase component of the stored total phase drift, and
a quadrature image rejection mixer configured to receive the mode selection result in quadrature for mixing with the quadrature component of the stored total phase drift.

5. The OEO of claim 2, wherein the drift compensation circuit further comprises:
a processor configured to store the total phase drift and update the stored total phase drift based on the received detected phase difference from the PLL.

6. The OEO of claim 2, wherein the vector modulator operates at an intermediate frequency, the OEO further comprising a transposition network in communication with the vector modulator, the transposition network configured to:
receive the mode selection result from the mode selection filter and downconvert the mode selection result to the intermediate frequency for communication to the vector modulator at the intermediate frequency, and
receive the drift compensated mode selection result signal from the vector modulator and upconvert the drift compensated mode selection result to an OEO output frequency for communication to the OEO.

7. The OEO of claim 1, wherein the PLL further comprises:
a phase frequency detector (PFD) configured to receive the drift compensated mode selection result and the local reference signal, and configured to output the detected phase difference, and
a phase shifter configured to receive the drift compensated mode selection result and the detected phase difference, and configured to output the PLL output at the OEO output frequency, the locking bandwidth of the PLL being based on a phase range of the phase shifter.

8. The OEO of claim 1, wherein the set of optical domain components comprises:
an optical source for generating an optical signal, and
an optical delay line coupled between the optical source and the output of the set of optical domain components, the optical delay line for reducing phase noise in the optical signal based on a length of the optical delay line.

9. The OEO of claim 8, wherein the set of optical domain components further comprises:
an optical power splitter coupled between the optical source and the optical delay line, the optical power splitter configured to split the optical signal into a first optical signal and a second optical signal;
the optical delay line further comprising a first optical delay line having a first length, and a second optical delay line having a second length greater than the first length;
the first optical delay line configured to receive the first optical signal and second delay line configured to receive the second optical signal, and
an optical combiner coupled between the delay line and the output of the set of optical domain components, the optical combiner configured to combine an output of the first optical delay line and the second optical delay line.

10. The OEO of claim 9, wherein the first length is selected to establish a desired mode spacing of the optical signal, and the second length is selected to reduce a phase noise of the optical signal.

11. The OEO of claim 7, wherein the set of optical domain components further comprises:
an optical modulator configured to receive the optical signal and the PLL output, the optical modulator configured to modulate the optical signal based on the PLL output.

12. The OEO of claim 1, wherein the mode selection filter comprises:
a first mode selection filter having a first passband;
a second mode selection filter having a second passband overlapping with the first passband to define an overlapping passband, and
wherein the overlapping passband is configured to isolate a desired oscillatory mode.

13. A method for compensating for phase drift in an optoelectronic oscillator, comprising:
converting an output of a set of optical domain components to an input of a set of RF domain components;
generating a mode selection result based on the input;
modulating, in a vector based coordinate system, a phase of the mode selection result based on a stored total phase drift;
maintaining a phase lock between a phase lock loop (PLL) and a local oscillator based on a phase difference detected between the phase of the mode selection result and a phase of the local oscillator;
updating the stored total phase drift based on the phase difference, and
providing a PLL output to the set of optical domain components.

14. The method according to claim 13, wherein modulating the phase of the mode selection result comprises:
mixing the mode selection result in-phase, with an in-phase component of the stored total phase drift, and
mixing the mode selection result in quadrature, with a quadrature component of the stored total phase drift.

15. The method according to claim 14, wherein modulating the phase of the mode selection result comprises receiving the mode selection result at a hybrid coupler configured to generate the mode selection result in-phase and in quadrature.

16. The method according to claim 13, further comprising:
transposing the input of the set of RF domain components from an RF domain to an IF domain;
implementing, in the IF domain, each of the steps of: generating the mode selection result, modulating the phase of the mode selection result, and maintaining the phase lock of the PLL, and
transposing the PLL output from the IF domain to the RF domain.

17. The method according to claim 13, wherein the set of optical domain components comprises an optical source and an optical delay line, wherein the output of the set of optical domain components comprises transmitting an output of the optical source through the optical delay line.

18. The method according to claim 17, wherein the optical delay line comprises a first optical delay line having a first length and a second optical delay line having a second length, wherein transmitting the output of the optical source through the optical delay line comprises:
- splitting the output of the optical source into a first optical source output and a second optical source output,
- transmitting the first optical source output through the first optical delay line-, and
- transmitting the second optical source output through the second optical delay line;
- wherein the output of the set of optical domain components comprises an output of the first optical delay line and an output of the second optical delay line.

19. The method according to claim 18, wherein the first length is selected for implementing a mode spacing and the second length is selected for reducing a phase noise.

20. A non-transitory computer readable medium having instructions stored thereon, that when executed by a processor, cause the processor to execute the method steps according to claim 13.

* * * * *